(12) United States Patent
Morimoto et al.

(10) Patent No.: US 8,937,286 B2
(45) Date of Patent: Jan. 20, 2015

(54) SOLID SCINTILLATOR AND ELECTRON BEAM DETECTOR USING THE SAME

(71) Applicants: Kazumitsu Morimoto, Kamakura (JP); Yoshitaka Adachi, Yokohama (JP); Akihisa Saito, Yokohama (JP); Eiji Oyaizu, Yokohama (JP); Masaki Toyoshima, Fujisawa (JP)

(72) Inventors: Kazumitsu Morimoto, Kamakura (JP); Yoshitaka Adachi, Yokohama (JP); Akihisa Saito, Yokohama (JP); Eiji Oyaizu, Yokohama (JP); Masaki Toyoshima, Fujisawa (JP)

(73) Assignees: Kabushiki Kaisha Toshiba, Minato-Ku (JP); Toshiba Materials Co., Ltd., Yokohama-Shi (JP)

( * ) Notice: Subject to any disclaimer, the term of this patent is extended or adjusted under 35 U.S.C. 154(b) by 0 days.

(21) Appl. No.: 14/350,196
(22) PCT Filed: Oct. 26, 2012
(86) PCT No.: PCT/JP2012/077760
§ 371 (c)(1),
(2) Date: Apr. 7, 2014
(87) PCT Pub. No.: WO2013/065605
PCT Pub. Date: May 10, 2013

(65) Prior Publication Data
US 2014/0246586 A1 Sep. 4, 2014

(30) Foreign Application Priority Data
Nov. 2, 2011 (JP) ................................. 2011-241697

(51) Int. Cl.
C09K 11/67 (2006.01)
C09K 11/77 (2006.01)
(Continued)

(52) U.S. Cl.
CPC ........... C09K 11/7774 (2013.01); H01J 37/244 (2013.01)
USPC .......... 250/370.11; 250/363.01; 252/301.4 R; 252/301.4 H; 252/301.4 F; 378/19; 378/98.8

(58) Field of Classification Search
CPC .............. C01G 15/006; C01P 2002/60; C09K 11/7774; G21K 4/00
USPC ...................... 252/301.4 R, 301.4 H, 301.4 F; 250/363.01, 370.11; 378/19, 98.8
See application file for complete search history.

(56) References Cited

U.S. PATENT DOCUMENTS 5,872,358 A  2/1999 Todokoro et al.
5,900,629 A  5/1999 Todokoro et al.
(Continued)

FOREIGN PATENT DOCUMENTS

CN  101646748 A  2/2010
JP  2001-243904 A1  9/2001
(Continued)

OTHER PUBLICATIONS

Akio Ikesue, "Ce: YAG Ceramic Scintillator for Electron Beam Detector," Journal of the Ceramic Society of Japan, vol. 108, No. 11, Nov. 1, 2000, pp. 1020-1023.
(Continued)

Primary Examiner — Nikita Wells
(74) Attorney, Agent, or Firm — Burr & Brown, PLLC

(57) ABSTRACT

The present invention provides a solid scintillator comprising a rare earth oxide sintered body, wherein: an afterglow time, which is the time required for a light output from the solid scintillator to degrease from a maximum value to 1/e of the maximum value, is 200 ns or shorter. The rare earth oxide sintered body preferably has a composition represented by a general formula (1):

$$Ln_a X_b O_c : Ce \quad (1),$$

wherein Ln is one or more elements selected from Y, Gd and Lu; X is one or more elements selected from Si, Al and B; and a, b and c satisfy $1 \le a \le 5$, $0.9 \le b \le 6$, and $2.5 \le c \le 13$, respectively.

12 Claims, 2 Drawing Sheets

(51) Int. Cl.
*C09K 11/08* (2006.01)
*H01J 37/244* (2006.01)

(56) References Cited

U.S. PATENT DOCUMENTS

| | | | |
|---|---|---|---|
| 6,069,356 | A | 5/2000 | Todokoro et al. |
| 6,084,238 | A | 7/2000 | Todokoro et al. |
| 6,858,159 | B2 * | 2/2005 | Lyons .................... 252/301.4 F |
| 7,608,829 | B2 | 10/2009 | Loureiro et al. |
| 8,377,335 | B2 * | 2/2013 | Fukuta et al. .......... 252/301.4 H |
| 8,431,042 | B2 * | 4/2013 | Fukuta et al. .......... 252/301.4 R |
| 2002/0075992 | A1 | 6/2002 | Jiang |
| 2007/0131908 | A1 | 6/2007 | Krishna et al. |
| 2009/0101817 | A1 | 4/2009 | Ohshima et al. |
| 2010/0193739 | A1 | 8/2010 | Peuchert et al. |
| 2011/0303873 | A1 | 12/2011 | Fukuta et al. |
| 2013/0306874 | A1 | 11/2013 | Yoshikawa et al. |

FOREIGN PATENT DOCUMENTS

| | | |
|---|---|---|
| JP | 2002-204016 A1 | 7/2002 |
| JP | 2002-243862 A1 | 8/2002 |
| JP | 2007-161577 A1 | 6/2007 |
| JP | 2008-024739 A1 | 2/2008 |
| JP | 2009-099468 A1 | 5/2009 |
| JP | 2010-100694 A1 | 5/2010 |
| JP | 2010-174211 A1 | 8/2010 |
| JP | 2010-235388 A1 | 10/2010 |
| JP | 2010-235433 A1 | 10/2010 |
| JP | 2012-158485 A1 | 8/2012 |
| WO | 2010/095737 A1 | 8/2010 |
| WO | 2012/105202 A1 | 8/2012 |

OTHER PUBLICATIONS

International Search Report dated Nov. 20, 2012.

Chinese Office Action (With English Translation), dated Nov. 4, 2014 (16 pages).

"The Synthesis and Spectral Properties of Ce: YAP crystal and Ce: YAG nanophosphor," 2007 (3 pages).

* cited by examiner

SOLID SCINTILLATOR AND ELECTRON BEAM DETECTOR USING THE SAME

TECHNICAL FIELD

The present invention relates to a solid scintillator and an electron beam detector using the solid scintillator.

BACKGROUND ART

An electron beam detector is for detecting a secondary electron emitted from a sample surface by an electron beam with which the sample surface is irradiated from an electron gun. For example, the electron beam detector is used as a secondary electron detector (SED) constituting a scanning type electron microscope (SEM) or the like. With use of a SEM, it is possible to recognize a surface state of a sample in the form of an image.

The secondary electron detector comprises: a scintillator that emits light by converting an incident secondary electron into visible light, ultraviolet light or the like; and a photoelectron multiplier tube that converts light emitted from the scintillator into electric energy.

Until now, a single crystal YAG is known as a material of the scintillator as described in the paragraph [0031] of Patent Document 1 (Japanese Patent Laid-Open No. 2001-243904). Further, Patent Document 2 (Japanese Patent Laid-Open No. 2009-99468) describes a phosphor layer formed by coating a mixture of phosphor powder such as ZnO with an adhesive on a transparent substrate or the like and then drying it.

PRIOR ART DOCUMENTS

Patent Documents

Patent Document 1: Japanese Patent Laid-Open No. 2001-243904
Patent Document 2: Japanese Patent Laid-Open No, 2009-99468

SUMMARY OF THE INVENTION

Problems to be Solved by the Invention

However, a problem of the single crystal YAG is that processing cost is high because the processing is difficult. In addition, problems of the phosphor layer formed by mixing phosphor powder and an adhesive are that manufacturability is poor because the mixture containing a phosphor must be uniformly coated on a transparent substrate or the like and, in addition, that durability is low because particle shedding of the phosphor powder, deterioration of the adhesive and the like are liable to occur. Furthermore, a problem of the phosphor layer formed by mixing phosphor powder and an adhesive is also that a gas encapsulated in a resin is discharged to the outside of the resin during use for a long time.

Thus, a problem is that a conventional scintillator, especially a scintillator for a SEM apparatus, has poor manufacturability and low durability.

The present invention aims to solve the above problems and to provide a solid scintillator having good manufacturability and high durability and an electron beam detector using the solid scintillator.

Means for Solving the Problems

The solid scintillator of the present invention is intended to solve the above problems and is a solid scintillator comprising a rare earth oxide sintered body (sintered compact), wherein:

an afterglow time, which is the time required for a light output from the solid scintillator to degrease from a maximum value to 1/e of the maximum value, is 200 ns or shorter.

The rare earth oxide sintered body preferably has the composition represented by the following general formula (1):

[Formula 1]

$$Ln_a X_b O_c : Ce \qquad (1)$$

wherein Ln is one or more elements selected from Y, Gd and Lu; X is one or more elements selected from Si, Al and B; and a, b and c satisfy $1 \leq a \leq 5$, $0.9 \leq b \leq 6$, and $2.5 \leq c \leq 13$, respectively.

Further, it is also preferable that the rare earth oxide sintered body has the composition represented by the following general formula (2):

[Formula 2]

$$Y_2O_3 \cdot \beta^1 SiO_2 : Ce \qquad (2)$$

wherein $\beta^1$ meets $0.95 < \beta^1 < 1.05$.

Furthermore, it is also preferable that the rare earth oxide sintered body preferably has the composition represented by the following general formula (3):

[Formula 3]

$$\alpha^2 Y_2O_3 \cdot \beta^2 Al_2O_3 : Ce \qquad (3)$$

wherein $\alpha^2$ and $\beta^2$ meet $0.45 < \alpha^2 < 1.55$ and $0.45 < \beta^3 < 2.55$, respectively.

Still further, it is also preferable that the rare earth oxide sintered body preferably has the composition represented by the following general formula (4):

[Formula 4]

$$\alpha^3 Y_2O_3 \cdot \beta^3 Al_2O_3 : Ce \qquad (4)$$

wherein $\alpha^3$ and $\beta^3$ meet $0.45 < \alpha^3 < 0.55$ and $0.45 < \beta^3 < 0.55$, respectively.

Still furthermore, it is also preferable that the rare earth oxide sintered body preferably has the composition represented by the following general formula (5):

[Formula 5]

$$\alpha^4 Y_2O_3 \cdot \beta^4 Al_2O_3 : Ce, Pr \qquad (5)$$

wherein $\alpha^4$ and $\beta^4$ meet $0.45 < \alpha^4 < 0.55$ and $0.45 < \beta^4 < 0.55$, respectively.

Yet further, it is also preferable that the rare earth oxide sintered body preferably has the composition represented by the following general formula (6):

[Formula 6]

$$0.8 Gd_2O_3 \cdot 0.2 Y_2O_3 \cdot \beta^5 SiO_2 : Ce \qquad (6)$$

wherein $\beta^5$ meets $0.95 < \beta^5 < 1.05$.

It is also preferable that the rare earth oxide sintered body has an average crystal particle (grain) size of 1 to 20 μm.

Further, it is also preferable that the rare earth oxide sintered body has a relative density of 99% or more.

It is also preferable that surface roughness Ra of an output surface outputting light to a photoelectron multiplier tube side in the solid scintillator is 0.3 to 10 μm.

The electron beam detector of the present invention is intended to solve the above problems and is characterized by using the above-described solid scintillator.

It is also preferable that the electron beam detector comprises a photoelectron multiplier tube.

The electron beam detector is preferably used in a SEM apparatus (scanning-type electron microscope apparatus).

Advantages of the Invention

The solid scintillator of the present invention shows short afterglow characteristics and has good manufacturability and high durability. The electron beam detector of the present invention uses this solid scintillator and therefore the resultant detector is very reliable.

DESCRIPTION OF EMBODIMENTS

Solid Scintillator

The solid scintillator of the present invention comprises a rare earth oxide sintered body (sintered compact). This rare earth oxide sintered body is a polycrystalline body of a rare earth oxide. In a word, the solid scintillator of the present invention is a polycrystal of a rare earth oxide.

Figure 1:
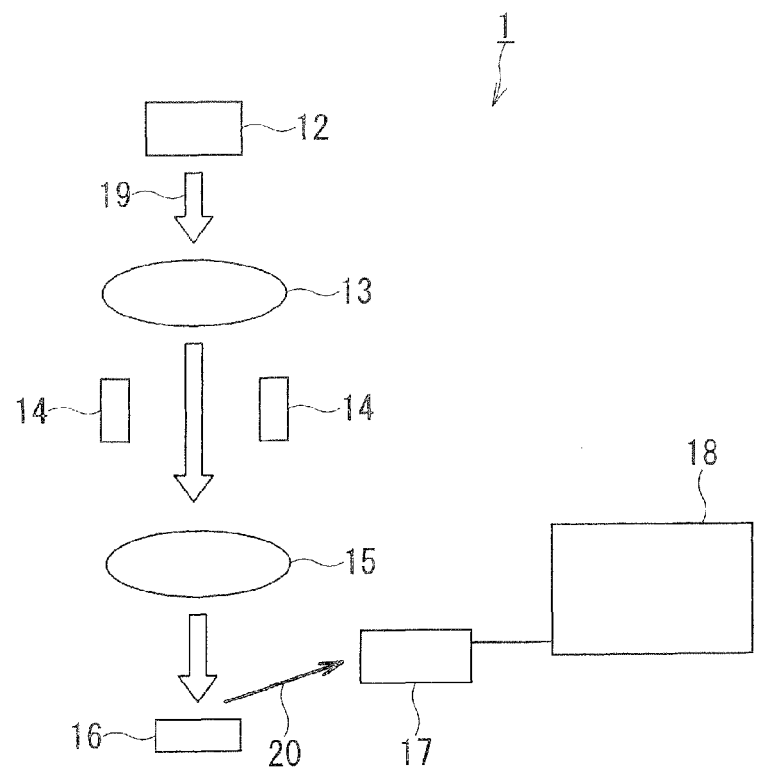
FIG. 1 is a diagram illustrating an outline of a SEM apparatus in which the solid scintillator according to the present invention is used.
Figure 2:
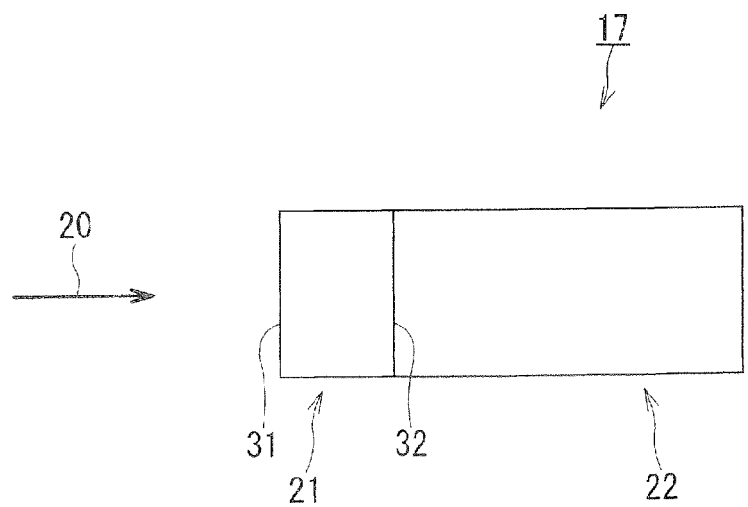
FIG. 2 is a diagram showing an example of a secondary electron detection unit in which the solid scintillator according to the present invention is used.
Figure 3:
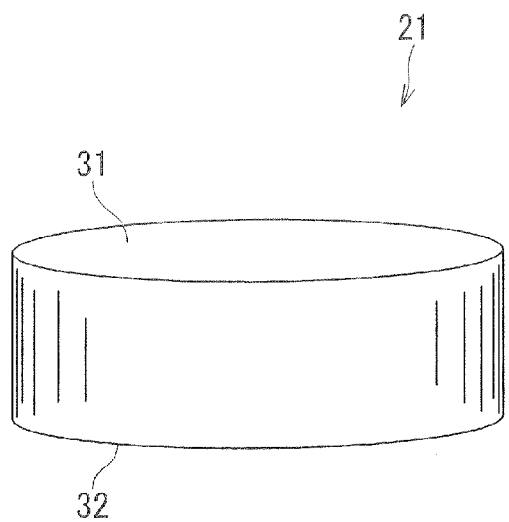
FIG. 3 is a diagram showing an example of the solid scintillator according to the present invention.

First, there will be explained an apparatus in which the solid scintillator of the present invention is used. FIG. 1 is a diagram illustrating an outline of a SEM apparatus in which the solid scintillator according to the present invention is used. FIG. 2 is a diagram showing an example of a secondary electron detection unit in which the solid scintillator according to the present invention is used. FIG. 3 is a diagram showing an example of the solid scintillator according to the present invention.

As shown in FIG. 1, in a SEM apparatus (scanning-type electron microscope apparatus) 1, after an electron beam 19 emitted from an electron gun 12 passes through a focusing lens 13, a scanning coil 14 and an objective lens 15 in this order, a measurement sample 16 is irradiated with the electron beam 19. As the measurement sample 16 is irradiated with the electron beam 19, a secondary electron 20 is generated from the surface of the measurement sample 16.

A secondary electron detection unit 17 is provided in the vicinity of the measurement sample 16. As shown in FIG. 2, this secondary electron detection unit 17 comprises: a solid scintillator 21 receiving the secondary electron 20 on an input surface 31 and emitting light from an output surface 32; and a photoelectron multiplier tube 22 for detecting light emitted from the solid scintillator 21. The solid scintillator 21 has a columnar shape as shown in FIG. 3.

In this secondary electron detection unit 17, a high voltage of approximately +10 kV is applied for the measurement sample 16. Therefore, the secondary electron 20 generated from the surface of the measurement sample 16 is attracted to the high voltage and then collides with the input surface 31 of the solid scintillator 21 constituting the secondary electron detection unit 17, and enters into the solid scintillator 21. The solid scintillator 21 emits light because of the entry of the secondary electron 20 and emits light from the output surface 32. This emitted light is detected with a photoelectron multiplier tube 22 and converted into an electrical signal. This electric signal is sent to a monitor 18, and thereby a secondary electron image of the measurement sample 16 is displayed on the monitor 18.

FIG. 2 shows a configuration in which the secondary electron detection unit 17 comprises the solid scintillator 21 and the photoelectron multiplier tube 22. However, the secondary electron detection unit 17 may have a structure in which an auxiliary electrode called a collector is installed in front of the solid scintillator 21 or in which a light guide is installed between the solid scintillator 21 and the photoelectron multiplier tube 22.

In such a SEM apparatus 1, the solid scintillator 21 emits light on the basis of the secondary electron 20 generated from the surface of the measurement sample 16, and this light is detected with the photoelectron multiplier tube 22. Thus, in order to obtain a clear secondary electron image in the SEM apparatus 1, it is preferable that the solid scintillator 21 emits light for a short time, i.e. the solid scintillator 21 has short afterglow. The reason is as follows: in the SEM apparatus 1, the electron beam 19 is emitted intermittently and the secondary electron 20 is generated intermittently from the surface of the measurement sample 16; therefore, when the solid scintillator 21 has a short afterglow, light emission by the secondary electron 20 can be repeated with high frequency and then a highly accurate image can be obtained.

Additionally, in the SEM apparatus 1, the measurement sample 16 and the solid scintillator 21 are placed in a sample chamber maintained at a vacuum of $1 \times 10^{-3}$ Pa or less. This is because the detection of the secondary electron 20 becomes inaccurate if the sample chamber is not in vacuum. Therefore, it is required for the SEM apparatus 1 that the structure and property of the solid scintillator 21 are stable in a vacuum.

As for a material of the solid scintillator 21, there are generally known a solid scintillator in which an organic luminous material is dissolved into a resin, a solid scintillator in which phosphor powder is dispersed in a resin, a solid scintillator made of a light emitting inorganic luminous single crystal, a solid scintillator made of an inorganic luminous polycrystal and the like. Among these, the solid scintillator using a resin causes a problem in measurement accuracy of the electron beam detector since a gas is generated from the resin during use in the SEM apparatus 1 for a long time and then a vacuum cannot be maintained in the sample chamber. Therefore, for the solid scintillator 21 used in the SEM apparatus 1, there is preferred the solid scintillator made of an inorganic luminous single crystal or the solid scintillator made of an inorganic luminous polycrystal from the viewpoint of no gas generation.

Furthermore, when the solid scintillator 21 is made of an inorganic single crystal or an inorganic polycrystal, it is preferable that the solid scintillator 21 is easy to be cut out from a large inorganic single crystal or inorganic polycrystal as a raw material into a predetermined size, i.e. its workability is good.

In general, an inorganic polycrystal is more excellent in workability than an inorganic single crystal. Therefore, for the solid scintillator 21 used in the SEM apparatus 1, the solid scintillator made of an inorganic polycrystal is most preferred.

The solid scintillator 21 of the present invention is made of a rare earth oxide sintered body that is such an inorganic polycrystal and is further a solid scintillator having short afterglow.

(Composition of the Rare Earth Oxide Sintered Body)

The rare earth oxide sintered body constituting the solid scintillator 21 of the present invention has a composition represented by the following general formula (1):

[Formula 7]

$$Ln_a X_b O_c:Ce \quad (1)$$

wherein Ln is one or more elements selected from Y, Gd and Lu; X is one or more elements selected from Si, Al and B; and a, b and c satisfy $1 \leq a \leq 5$, $0.9 \leq b \leq 6$, and $2.5 \leq c \leq 13$, respectively. The rare earth oxide having this composition is preferable because its sintered body is easily formed and then manufacturability is improved.

The rare earth oxide sintered body having the composition represented by the general formula (1) is a broader concept including the rare earth oxide sintered bodies having compositions represented by the following general formulas (2) to (6).

It is preferable that the rare earth oxide sintered body has a composition represented by the following general formula (2) since afterglow time of the solid scintillator is further shortened to 150 ns or less.

[Formula 8]

$$Y_2O_3 \cdot \beta^1 SiO_2:Ce \quad (2)$$

wherein $\beta^1$ satisfies $0.95 < \beta^1 < 1.05$.

It is also preferable that the rare earth oxide sintered body has a composition represented by the following general formula (3) since afterglow time of the solid scintillator is further shortened to 150 ns or less.

[Formula 9]

$$\alpha^2 Y_2O_3 \cdot \beta^2 Al_2O_3:Ce \quad (3)$$

wherein $\alpha^2$ and $\beta^2$ satisfy $1.45 < \alpha^2 < 1.55$ and $2.45 < \beta^2 < 2.55$, respectively.

It is also preferable that the rare earth oxide sintered body has a composition represented by the following general formula (4) since afterglow time of the solid scintillator is further shortened to 150 ns or less.

[Formula 10]

$$\alpha^3 Y_2O_3 \cdot \beta^3 Al_2O_3:Ce \quad (4)$$

wherein $\alpha^3$ and $\beta^3$ satisfy $0.45 < \alpha^3 < 0.55$ and $0.45 < \beta^3 < 0.55$, respectively.

It is preferable that the rare earth oxide sintered body has a composition represented by the following general formula (5) since afterglow time of the solid scintillator is further shortened to 150 ns or less.

[Formula 11]

$$\alpha^4 Y_2O_3 \cdot \beta^4 Al_2O_3:Ce,Pr \quad (5)$$

wherein $\alpha^4$ and $\beta^4$ satisfy $0.45 < \alpha^4 < 0.55$ and $0.45 < \beta^4 < 0.55$, respectively.

It is preferable that the rare earth oxide sintered body has a composition represented by the following general formula (6) since afterglow time of the solid scintillator is further shortened to 150 ns or less.

[Formula 12]

$$0.8Gd_2O_3 \cdot 0.2Y_2O_3 \cdot \beta^5 SiO_2:Ce \quad (6)$$

wherein $\beta^5$ satisfies $0.95 < \beta^5 < 1.05$.

In the general formula (1) to (4) and (6), the examples using Ce as an activator are shown, but another rare earth element such as Pr can be used as an activator in the present invention in place of or in addition to Ce. Among the rare earth elements used as an activator, Ce is most preferable because its light output is large.

(Average Crystal Particle Size of the Rare Earth Oxide Sintered Body)

The rare earth oxide sintered body constituting the solid scintillator 21 of the present invention has an average crystal particle (grain) size of usually 1 to 20 µm and preferably 3 to 12 µm.

When an average crystal particle size of the rare earth oxide sintered body is 1 to 20 µm, the maximum diameter of a pore of the rare earth oxide sintered body can be decreased to 1 µm or less, and therefore light output of the solid scintillator becomes larger.

On the other hand, when an average crystal particle size of the rare earth oxide sintered body is less than 1 µm, since the proportion of the grain boundary in the rare earth oxide sintered body is increased, there may be a fear that the light output of the solid scintillator may be decreased.

Further, if an average crystal particle size of the rare earth oxide sintered body exceeds 20 µm, since a triple point of the grain boundary is enlarged, strength of the solid scintillator may be lowered. When strength of the solid scintillator is lowered in this way, cracking and chipping easily occurs during incorporation of the solid scintillator into the secondary electron detection unit 17.

(Relative Density of the Rare Earth Oxide Sintered Body)

The rare earth oxide sintered body constituting the solid scintillator 21 of the present invention has a relative density of usually 99% or more and preferably 99.5% to 100%.

Herein, the relative density is a value obtained by: (actual density of the rare earth oxide sintered body measured by Archimedes' method/theoretical density of the rare earth oxide sintered body)×100%=relative density (%).

The relative density is calculated with theoretical densities of $Y_2SiO_5$ sintered body, $Y_3Al_5O_{12}$ sintered body, $YAlO_3$ sintered body and $(Gd_{0.8}Y_{0.2})_2SiO_5$ sintered body of 4.46 g/cm$^3$, 4.56 g/cm$^3$, 5.56 g/cm$^3$ and 6.35 g/cm$^3$, respectively.

When the relative density of the rare earth oxide sintered body is less than 99%, i.e. when a lot of pores are present in the rare earth oxide sintered body, there is a fear that light emission of the solid scintillator is inhibited by the pores to decrease light output.

(Surface Roughness of the Output Surface of the Solid Scintillator)

In the solid scintillator 21 of the present invention, surface roughness Ra of the output surface 32 outputting light to the photoelectron multiplier tube 22 side is 0.3 to 10 µm.

It is preferable that the surface roughness Ra of the output surface 32 of the solid scintillator 21 is 0.3 to 10 µm since the photoelectron multiplier tube 22 is efficiently irradiated with the light output from the solid scintillator 21.

(Afterglow Time of the Solid Scintillator)

In the solid scintillator of the present invention, afterglow time that is time required for the light output of the solid scintillator to change from the maximum value to 1/e of the maximum value (hereinafter simply referred to as "afterglow time") is 200 ns (nanoseconds) or less and preferably 150 ns or less.

Figure 4:
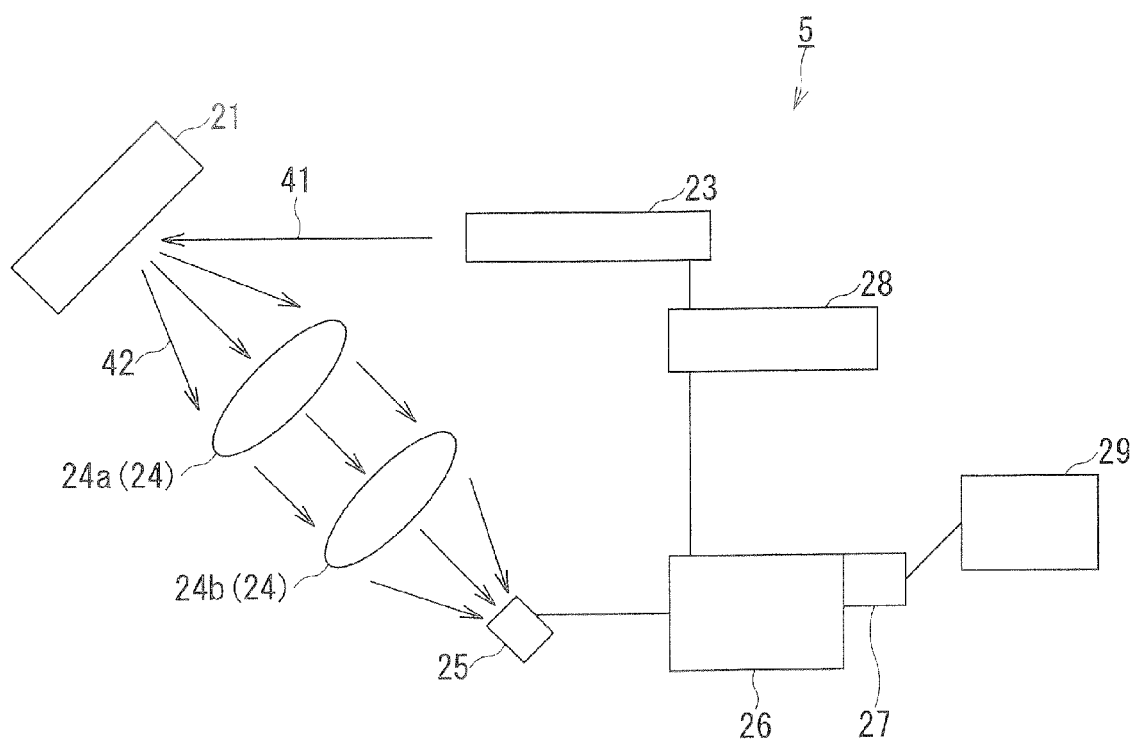
FIG. 4 is a diagram showing an example of a measurement method of afterglow time of the solid scintillator.

A measurement method of the afterglow time of the solid scintillator will be explained hereunder. FIG. 4 is a diagram showing an example of measurement method of the afterglow time of the solid scintillator.

As shown in FIG. 4, an afterglow time measurement apparatus 5 used to measure the afterglow time of the solid scintillator comprises: a Nd:YAG pulse laser oscillator 23 for irradiating the solid scintillator 21 with laser light 41 as a measurement sample; condenser lenses 24 (24a, 24b) for condensing light 42 emitted from the solid scintillator by receiving the laser light 41; an optical fiber 25 for sending the light condensed by the condenser lenses 24; a spectroscope 26 for spectral processing of the light sent from the optical fiber 25; an ICCD (Intensified Charge Coupled Device) 27 for detecting fluorescence spectrum dispersed by the spectroscope 26; a pulse generator 28 for changing the time from the irradiation with the laser light 41 until the detection of the light 42; and a personal computer 29 for analyzing the fluorescence spectrum detected by the ICCD 27.

A measurement method of the afterglow time of the solid scintillator is as follows:

First, a measurement sample (rare earth oxide sintered body) 21 having a flat surface is provided as a solid scintillator. Next, the flat surface of the measurement sample 21 is irradiated with the laser light 41 having a peak wavelength of 266 nm, a pulse length of 14 ns and a repetition frequency of 10 Hz from a Nd:YAG pulsed laser unit 23 at an angle of 45° with respect to the flat surface of the measurement sample 21; the light 42 emitted from the measurement sample 21 by receiving the laser light 41 is condensed by the condenser lenses 24 (24a, 24b) placed in front of the flat surface of the measurement sample 21 and then sent to the spectroscope 26 through the optical fiber 25; the light 42 sent to the spectroscope 26 is dispersed to generate fluorescence spectrum; and the obtained fluorescence spectrum is detected by the ICCD 27.

In addition, the time from the irradiation with the laser light 41 until the detection of the light 42 is varied using the pulse generator (10 Hz) 28, and time variation of the fluorescence spectrum is measured by synchronizing the fluorescence with the excitation pulse. The result of the time variation of fluorescence intensity is sent to the personal computer 29. In the personal computer 29, there is measured time taken for light output of the solid scintillator 21 to change from the maximum value to 1/e of the maximum value, and this time is calculated as afterglow time.

(Method for Fabricating a Solid Scintillator)

Next, a fabricating method of the solid scintillator will be explained. The fabricating method of the solid scintillator of the present invention is not particularly limited, but the following method can be given as a method for efficiently obtaining the solid scintillator.

First, rare earth oxide phosphor powder is prepared as a raw material. For example, when a $Y_2SiO_5$:Ce sintered body is produced as a rare earth oxide sintered body, $Y_2SiO_5$:Ce powder is prepared.

An average particle size (i.e. average grain diameter) of the rare earth oxide phosphor powder is within the range of usually 0.5 to 10 μm and preferably 1 to 8 μm. When the average particle size of the rare earth oxide phosphor powder is within the range of 0.5 to 10 μm, an average crystal particle size of the obtained rare earth oxide sintered body can be easily controlled within the range of 1 to 20 μm.

Herein, the average particle size of the rare earth oxide phosphor powder is a value calculated by an electrical resistance method.

Further, if necessary, a sintering aid may be added to the rare earth oxide phosphor powder. As for the sintering aid, it is possible to use, for example, a fluoride such as LiF, $Li_2GeF_6$, $NaBF_4$, $BaF_2$ and $AlF_3$, or an oxide such as $SiO_2$ and $B_2O_3$.

Next, the rare earth oxide phosphor is filled in a molding die, and a sintering step is performed. It is preferable that the sintering step is HIP (hot isostatic pressing) treatment. Also, it is preferable that the condition of the HIP treatment is performed at temperature of 1200 to 1900° C. and a pressure of 500 to 1500 atm. Even using a rare earth oxide phosphor powder that is a hardly sinterable material, the HIP treatment can provide a rare earth oxide sintered body having a relative density of 99% or more without using a sintering aid. Further, a molding step such as CIP (cold isostatic pressing) molding may be carried out before the HIP treatment.

In the sintering step, it is preferable that the size of the obtained rare earth oxide sintered body is set so that the sintered ingot is larger than a scintillator as a final product. This is because each scintillator can be cut out by cutting processing of the sintered ingot and therefore mass productivity can be high.

Then, the obtained rare earth oxide sintered body is subjected to heat treatment at a temperature of 900 to 1400° C. This heat treatment allows adjusting the average crystal particle size and relaxing a processing strain caused during the cutting processing for mass production. The heat treatment time is preferably 5 to 15 hours.

The obtained rare earth oxide sintered body becomes a solid scintillator by performing a surface polishing as necessary.

According to the above-described fabricating method of the solid scintillator, it is possible to efficiently obtain a solid scintillator in which the relative density and average crystal particle size are adjusted. Further, the use of the HIP treatment allows cutting processing from a large ingot of the rare earth oxide sintered body, and then efficient productivity can be also enhanced.

The shape of the solid scintillator 21 is not particularly limited and may be columnar as shown in FIG. 3 or may be various shapes such as a rectangular cuboid.

Further, when the solid scintillator 21 has a columnar-shape, the size of the solid scintillator 21 is, for example, a thickness of 0.1 to 2.0 mm and a diameter of 5 to 20 mm. Also, when the solid scintillator 21 is a rectangular cuboid, for example, the thickness is set to 0.1 to 2.0 mm and the length of each side is set to 5 to 20 mm.

If the thickness of the solid scintillator 21 is less than 0.1 mm, strength of the solid scintillator 21 may be insufficient. Meanwhile, if the thickness of the solid scintillator 21 exceeds 2.0 mm, light emission characteristics is not improved as compared with the case of thickness of 2.0 mm and, moreover, light transmittance becomes worse and thus light output decreases.

Since the solid scintillator 21 of the present invention is made of the particular rare earth oxide sintered body, strength of the material itself is high. In addition, since it is easy to perform cut processing of the solid scintillator 21 of the present invention from a large ingot of the rare earth oxide sintered body, a thin solid scintillator having a thickness of approximately 0.1 to 2.0 mm can be easily produced.

(Effect of the Solid Scintillator of the Present Invention)

The solid scintillator of the present invention exhibits excellent characteristics of short afterglow, i.e. afterglow time taken for light output to change from the maximum value to 1/e of the maximum value is 200 ns or less, thus being excellent characteristic.

The solid scintillator of the present invention is excellent in workability, and thus its manufacturability is also good.

Furthermore, since the solid scintillator of the present invention is not a mixture with a resin, there is no possibility that a gas is generated and the resin deteriorates during use. Therefore, reliability as a scintillator is very high.

Also, the solid scintillator of the present invention can also be improved in handling characteristics because strength of the rare earth oxide sintered body is high by adjusting its relative density and average crystal particle size.

[Electron Beam Detector]

The electron beam detector of the present invention uses the solid scintillator of the present invention. For example, the electron beam detector of the present invention is the secondary electron detection unit 17 shown in FIG. 2.

As shown in FIG. 2, the secondary electron detection unit 17 as an electron beam detector is composed of the solid scintillator 21, and the photoelectron multiplier tube 22 for detecting a light emitted from the solid scintillator 21. In a word, the secondary electron detection unit 17 as an electron beam detector comprises the photoelectron multiplier tube 22. As shown in FIG. 1, the secondary electron detection unit 17 as the electron beam detector of the present invention can be used in, for example, the SEM apparatus 1.

(Effect of the Electron Beam Detector of the Present Invention)

Since the electron beam detector of the present invention uses the solid scintillator 21 of the present invention, a reliability as an electron beam detector is very high.

That is, the electron beam detector of the present invention does not use resins as a component of the solid scintillator 21 of the present invention, and therefore a gas is not generated from the solid scintillator 21 even under a vacuum condition. Thus, the electron beam detector of the present invention is particularly preferable for a component of the SEM apparatus 1 whose sample chamber must be evacuated. The electron beam detector of the present invention can be used not only for the SEM apparatus 1 but also can be widely used as a detector using an electron beam.

EXAMPLES

Examples will be shown below, but the present invention is not construed as being limited thereto.

Examples 1 to 3

$Y_2SiO_5$:Ce phosphor powder having an average particle size of 2.0 μm was provided as a raw material powder. The raw material powder was filled into a metal capsule, and subjected to HIP treatment under the condition of 1500° C. and 1000 atm to fabricate a $Y_2SiO_5$ sintered ingot having 10 mm diameter×3 mm thickness.

A sintered body having a thickness of 1.0 mm, one having a thickness of 0.5 mm and one having a thickness of 0.3 mm were each cut out from thus obtained sintered ingot. The sintered body having a thickness of 1.0 mm was subjected to heat treatment in the air at a temperature of 1100° C. for 8 hours. Further, the sintered body having a thickness of 0.5 mm was subjected to heat treatment in the air at a temperature of 1200° C. for 10 hours. Furthermore, the sintered body having a thickness of 0.3 mm was subjected to heat treatment in the air at a temperature of 1300° C. for 9 hours.

The surface of the sintered body after completion of the heat treatment was polished so that its surface roughness Ra was 1 μm or less thereby to manufacture a solid scintillator. Among the obtained solid scintillators, the solid scintillator having 1.0 mm thickness×10 mm diameter was used in Example 1, the solid scintillator having 0.5 mm thickness×10 mm diameter was used in Example 2, and the solid scintillator having 0.3 mm thickness×10 mm diameter was used in Example 3.

The fabricating (manufacturing) conditions are shown in Table 1. The fabricating conditions of the following Examples and Comparative Examples are also shown in Table 1.

TABLE 1

| Sample No. | Phosphor Powder | | Sintered Body | | | | | | | | |
| | Composition | Average Grain Size (μm) | Sintering Conditions | | Heat Treatment Conditions | | Ingot | | Scintillator | | Remark |
| | | | Sintering Method | Temperature (°C.) | Pressure (atm) | Temperature (°C.) | Time (H) | Thickness (mm) | Diameter (mm) | Thickness (mm) | Diameter (mm) | |
| Example 1 | $Y_2SiO_5$:Ce | 2.0 | HIP | 1500 | 1000 | 1100 | 8 | 3 | 10 | 1.0 | 10 | |
| Example 2 | $Y_2SiO_5$:Ce | 2.0 | HIP | 1500 | 1000 | 1200 | 10 | 3 | 10 | 0.5 | 10 | |
| Example 3 | $Y_2SiO_5$:Ce | 2.0 | HIP | 1500 | 1000 | 1300 | 9 | 3 | 10 | 0.3 | 10 | |
| Comparative Example 1 | $Y_2SiO_5$:Ce | 3.0 | — | — | — | — | — | — | — | 1.0 | 10 | Resin-Mixed type |
| Example 4 | $Y_3Al_5O_{12}$:Ce | 4.0 | HIP | 1550 | 1100 | 1000 | 12 | 3 | 10 | 1.0 | 10 | |
| Example 5 | $Y_3Al_5O_{12}$:Ce | 4.0 | HIP | 1550 | 1100 | 1100 | 10 | 3 | 10 | 0.5 | 10 | |
| Example 6 | $Y_3Al_5O_{12}$:Ce | 4.0 | HIP | 1550 | 1100 | 1200 | 9 | 3 | 10 | 0.3 | 10 | |
| Comparative Example 2 | $Y_3Al_5O_{12}$:Ce | 5.0 | — | — | — | — | — | — | — | 1.0 | 10 | Resin-Mixed type |
| Example 7 | $YAlO_3$:Ce, Pr | 6.2 | HIP | 1650 | 1500 | 1300 | 9 | 3 | 10 | 1.0 | 10 | |
| Example 8 | $YAlO_3$:Ce, Pr | 6.2 | HIP | 1650 | 1500 | 1200 | 8 | 3 | 10 | 0.5 | 10 | |
| Example 9 | $YAlO_3$:Ce, Pr | 6.2 | HIP | 1650 | 1500 | 1100 | 7 | 3 | 10 | 0.3 | 10 | |
| Comparative Example 3 | $YAlO_3$:Ce, Pr | 7.0 | — | — | — | — | — | — | — | 1.0 | 10 | Resin-Mixed type |
| Example 10 | $YAlO_3$:Ce | 3.5 | HIP | 1850 | 1300 | 1500 | 7 | 3 | 10 | 1.0 | 10 | |
| Example 11 | $YAlO_3$:Ce | 3.5 | HIP | 1850 | 1300 | 1400 | 6 | 3 | 10 | 0.5 | 10 | |
| Example 12 | $YAlO_3$:Ce | 3.5 | HIP | 1850 | 1300 | 1300 | 5 | 3 | 10 | 0.3 | 10 | |
| Comparative Example 4 | $YAlO_3$:Ce | 4.0 | — | — | — | — | — | — | — | 1.0 | 10 | Resin-Mixed type |
| Example 13 | $(Gd_{0.8}Y_{0.2})_2SiO_5$:Ce | 5.0 | HIP | 1300 | 1200 | 1100 | 15 | 3 | 10 | 0.3 | 10 | |
| Example 14 | $(Gd_{0.8}Y_{0.2})_2SiO_5$:Ce | 5.0 | HIP | 1300 | 1200 | 1100 | 15 | 3 | 10 | 0.3 | 10 | |
| Example 15 | $(Gd_{0.8}Y_{0.2})_2SiO_5$:Ce | 5.0 | HIP | 1300 | 1200 | 1100 | 15 | 3 | 10 | 0.3 | 10 | |
| Example 16 | $(Gd_{0.8}Y_{0.2})_2SiO_5$:Ce | 5.0 | HIP | 1300 | 1200 | 1100 | 15 | 3 | 10 | 0.3 | 10 | |

TABLE 1-continued

| | Phosphor Powder | | Sintering Conditions | | Heat Treatment Conditions | | Sintered Body | | | | |
|---|---|---|---|---|---|---|---|---|---|---|---|
| | | Average Grain Size (μm) | Sintering Method | Temperature (°C.) | Pressure (atm) | Temperature (°C.) | Time (H) | Ingot Thickness (mm) | Ingot Diameter (mm) | Scintillator Thickness (mm) | Scintillator Diameter (mm) |
| Sample No. | Composition | | | | | | | | | | | Remark |
| Example 17 | (Gd$_{0.8}$Y$_{0.2}$)$_2$SiO$_5$:Ce | 5.0 | HIP | 1300 | 1200 | 1100 | 15 | 3 | 10 | 0.3 | 10 |
| Example 18 | (Gd$_{0.8}$Y$_{0.2}$)$_2$SiO$_5$:Ce | 5.0 | HIP | 1300 | 1200 | 1100 | 15 | 3 | 10 | 0.3 | 10 |
| Example 19 | (Gd$_{0.8}$Y$_{0.2}$)$_2$SiO$_5$:Ce | 5.0 | HIP | 1300 | 1200 | 1100 | 15 | 3 | 10 | 0.3 | 10 |
| Example 20 | (Gd$_{0.8}$Y$_{0.2}$)$_2$SiO$_5$:Ce | 5.0 | HIP | 1300 | 1200 | 1100 | 15 | 3 | 10 | 0.3 | 10 |

Comparative Example 1

Y$_2$SiO$_5$:Ce phosphor powder having an average particle size of 3.0 μm and a silicone resin were mixed and cured to prepare a resin mix type scintillator having 1.0 mm thickness×10 mm diameter and composed of 95 volume % of Y$_2$SiO$_5$:Ce phosphor powder and 5 volume % of silicone cured resin, which was used in Comparative Example 1.

Examples 4 to 6

Y$_3$Al$_5$O$_{12}$ phosphor powder having an average particle size of 4.0 μm was provided as raw material powder. The raw material powder was filled into a metal capsule and subjected to HIP treatment under the condition of 1550° C. and 1100 atm to fabricate a Y$_3$Al$_5$O$_{12}$ sintered ingot having 10 mm diameter×3 mm thickness.

A sintered body having a thickness of 1.0 mm, one having a thickness of 0.5 mm and one having a thickness of 0.3 mm were each cut out from the obtained sintered ingot. The sintered body having a thickness of 1.0 mm was subjected to heat treatment in the air at a temperature of 1000° C. for 12 hours. The sintered body having a thickness of 0.5 mm was subjected to heat treatment in the air at a temperature of 1100° C. for 10 hours. Further, the sintered body having a thickness of 0.3 mm was subjected to heat treatment in the air at a temperature of 1200° C. for 9 hours.

The surface of the sintered body after the heat treatment was polished so that its surface roughness Ra was 1 μm or less to manufacture a solid scintillator. Among the obtained solid scintillators, the solid scintillator having 1.0 mm thickness×10 mm diameter was used in Example 4, the solid scintillator having 0.5 mm thickness×10 mm diameter was used in Example 5, and the solid scintillator having 0.3 mm thickness×10 mm diameter was used in Example 6.

Comparative Example 2

Y$_3$Al$_5$O$_{12}$:Ce phosphor powder having an average particle size of 5.0 μm and an epoxy resin were mixed and cured to prepare a resin mix type scintillator having 1.0 mm thickness×10 mm diameter and composed of 95 volume % of Y$_3$Al$_5$O$_{12}$:Ce phosphor powder and 5 volume % of epoxy cured resin, which was used in Comparative Example 2.

Examples 7 to 9

YAlO$_3$:Ce,Pr phosphor powder having an average particle size of 6.2 μm was prepared as a raw material powder. The raw material powder was filled into a metal capsule, and subjected to a HIP treatment under the condition of 1650° C. and 1500 atm to fabricate a YAlO$_3$:Ce,Pr sintered ingot having 10 mm diameter×3 mm thickness.

A sintered body having a thickness of 1.0 mm, one having a thickness of 0.5 mm and one having a thickness of 0.3 mm were each cut out from the obtained sintered ingot. The sintered body having a thickness of 1.0 mm was subjected to heat treatment in the air at a temperature of 1300° C. for 9 hours. The sintered body having a thickness of 0.5 mm was subjected to heat treatment in the air at a temperature of 1200° C. for 8 hours. Further, the sintered body having a thickness of 0.3 mm was subjected to heat treatment in the air at a temperature of 1100° C. for 7 hours.

The surface of the sintered body after the heat treatment was polished so that its surface roughness Ra was 1 μm or less to complete a solid scintillator. Among thus obtained solid scintillators, the solid scintillator having 1.0 mm thickness×10 mm diameter was used in Example 7, the solid scintillator having 0.5 mm thickness×10 mm diameter was used in Example 8, and the solid scintillator having 0.3 mm thickness×10 mm diameter was used in Example 9.

Comparative Example 3

YAlO$_3$:Ce,Pr phosphor powder having an average particle size of 7.0 μm and a raw material of polycarbonate were mixed and cured to prepare a resin mix type scintillator having 1.0 mm thickness×10 mm diameter and composed of 95 volume % of YAlO$_3$:Ce,Pr phosphor powder and 5 volume % of polycarbonate, which was used in Comparative Example 3.

Examples 10 to 12

YAlO$_3$:Ce phosphor powder having an average particle size of 3.5 μm was prepared as a raw material powder. The raw material powder was filled into a metal capsule, and subjected to HIP treatment under the condition of 1850° C. and 1300 atm to fabricate a YAlO$_3$:Ce sintered ingot having 10 mm diameter×3 mm thickness.

A sintered body having a thickness of 1.0 mm, one having a thickness of 0.5 mm and one having a thickness of 0.3 mm were each cut out from the obtained sintered ingot. The sintered body having a thickness of 1.0 mm was subjected to heat treatment in the air at a temperature of 1500° C. for 7 hours. The sintered body having a thickness of 0.5 mm was subjected to heat treatment in the air at a temperature of 1400° C. for 6 hours. Further, the sintered body having a thickness of 0.3 mm was subjected to heat treatment in the air at a temperature of 1300° C. for 5 hours.

The surface of the sintered body after heat treatment was polished so that its surface roughness Ra was 1 μm or less to complete a solid scintillator. Among the obtained solid scintillators, the solid scintillator having 1.0 mm thickness×10 mm diameter was used in Example 10, the solid scintillator having 0.5 mm thickness×10 mm diameter was used in Example 11, and the solid scintillator having 0.3 mm thickness×10 mm diameter was used in Example 12.

Comparative Example 4

YAlO$_3$:Ce phosphor powder having an average particle size of 4.0 μm and a raw material of methacrylic resin were mixed and cured to prepare a resin mix type scintillator having 1.0 mm thickness×10 mm diameter and composed of 95 volume % of YAlO$_3$:Ce phosphor powder and 5 volume % of methacrylic resin, which was used in Comparative Example 4.

Example 13 to 20

(Gd$_{0.8}$Y$_{0.2}$)$_2$SiO$_5$:Ce phosphor powder having an average particle size of 5.0 μm was prepared as a raw material powder. The raw material powder was filled into a metal capsule, and subjected to HIP treatment under the condition of 1300° C. and 1200 atm to fabricate a (Gd$_{0.8}$Y$_{0.2}$)$_2$SiO$_5$:Ce sintered ingot having 10 mm diameter×3 mm thickness.

Sintered bodies having a thickness of 0.3 mm were cut out from the obtained sintered ingot. The sintered bodies cut out were subjected to a heat treatment in the air at a temperature of 1100° C. for 15 hours.

The surface of each sintered body after the heat treatment was polished so that its surface roughness Ra was the predetermined value to manufacture a solid scintillator. Among the obtained solid scintillators, the solid scintillators having the following Ra values were used in the following Examples: one having Ra of 20 μm in Example 13; one having Ra of 10 μm in Example 14; one having Ra of 5 μm in Example 15; one having Ra of 2 μm in Example 16; one having Ra of 1 μm in Example 17; one having Ra of 0.5 μm in Example 18; one having Ra of 0.3 μm in Example 19; and one having Ra of 0.1 μm in Example 20.

For each of the solid scintillators of Examples 1 to 20, its average crystal particle size, relative density, light output and afterglow time were measured.

The measurement method of the average crystal particle size is as follows: first, enlarged photographs of a unit area of 100 μm×100 μm were taken at three places in an arbitrary cross-section of the sintered body; a straight line having 100 μm length was drawn on each of the enlarged photographs with a line intercept method, and the number of crystals existing on this straight line was counted; and the average value of the numbers of crystals at the three places was defined as an average crystal particle size.

A measurement method of the relative density is as follows: first, an actual density of the sintered body was measured by Archimedes' method; next, a theoretical density of the sintered body was determined using a literature or the like; for example, the theoretical density of Y$_2$SiO$_5$ sintered body was set to 4.46 g/cm$^3$ and the theoretical density of Y$_3$Al$_5$O$_{12}$ sintered body was set to 4.56 g/cm$^3$; furthermore, a relative density of the sintered body was calculated using the equation: (actual density of the sintered body/theoretical density of the sintered body)×100%.

A measurement method of the light output is as follows: first, the solid scintillator was exposed to an X-ray having a tube voltage of 40 kVp to measure the light output from the output surface of the solid scintillator; and the light outputs of Examples and Comparative Examples were calculated as a ratio with 100 as the light output of Example 1.

A measurement method of afterglow time is as follows: first, using the afterglow time measurement apparatus 5 shown in FIG. 4, the solid scintillator 21 was irradiated with the laser light 41 having a wavelength of 266 nm, a pulse length of 14 ns (nanoseconds) and 10 Hz from the Nd:YAG pulse laser oscillator 23; next, there were measured time taken for light output of the solid scintillator 21 to change from the maximum value to 1/e of the maximum value; and this time was defined as afterglow time.

Table 2 shows the measurement results of the average crystal particle size, relative density, light output and afterglow time of the solid scintillator and the surface roughness Ra of the output surface of the solid scintillator.

TABLE 2

| | Scintillator | | | | | |
|---|---|---|---|---|---|---|
| Sample No. | Composition | Average Crystal Particle Size (μm) | Relative Density (%) | Roughness of Surface Ra (μm) | Light Output (%) | Afterglow Time Until Maximum Light Output is reduced to be 1/e (ns) | Remark |
| Example 1 | Y$_2$SiO$_5$:Ce | 4 | 99.5 | <1 | 100 | 111 | |
| Example 2 | Y$_2$SiO$_5$:Ce | 6 | 99.6 | <1 | 145 | 113 | |
| Example 3 | Y$_2$SiO$_5$:Ce | 9 | 99.9 | <1 | 180 | 116 | |
| Comparative Example 1 | Y$_2$SiO$_5$:Ce | — | — | — | — | 105 | Resin-Mixed type |
| Example 4 | Y$_3$Al$_5$O$_{12}$:Ce | 6 | 99.6 | <1 | 185 | 111 | |
| Example 5 | Y$_3$Al$_5$O$_{12}$:Ce | 8 | 99.8 | <1 | 210 | 114 | |
| Example 6 | Y$_3$Al$_5$O$_{12}$:Ce | 10 | 99.9 | <1 | 230 | 115 | |
| Comparative Example 2 | Y$_3$Al$_5$O$_{12}$:Ce | — | — | — | — | 111 | Resin-Mixed type |
| Example 7 | YAlO$_3$:Ce, Pr | 10 | 99.5 | <1 | 140 | 113 | |
| Example 8 | YAlO$_3$:Ce, Pr | 14 | 99.7 | <1 | 175 | 115 | |
| Example 9 | YAlO$_3$:Ce, Pr | 18 | 99.8 | <1 | 205 | 116 | |
| Comparative Example 3 | YAlO$_3$:Ce, Pr | — | — | — | — | 113 | Resin-Mixed type |
| Example 10 | YAlO$_3$:Ce | 12 | 99.6 | <1 | 150 | 112 | |
| Example 11 | YAlO$_3$:Ce | 16 | 99.7 | <1 | 186 | 114 | |
| Example 12 | YAlO$_3$:Ce | 20 | 99.8 | <1 | 210 | 117 | |
| Comparative Example 4 | YAlO$_3$:Ce | — | — | — | — | 111 | Resin-Mixed type |
| Example 13 | (Gd$_{0.8}$Y$_{0.2}$)$_2$SiO$_5$:Ce | 10 | 99.7 | 20 | 170 | 112 | |
| Example 14 | (Gd$_{0.8}$Y$_{0.2}$)$_2$SiO$_5$:Ce | 10 | 99.7 | 10 | 180 | 110 | |

TABLE 2-continued

| Sample No. | Composition | Average Crystal Particle Size (μm) | Relative Density (%) | Roughness of Surface Ra (μm) | Light Output (%) | Afterglow Time Until Maximum Light Output is reduced to be 1/e (ns) | Remark |
|---|---|---|---|---|---|---|---|
| Example 15 | $(Gd_{0.8}Y_{0.2})_2SiO_5$:Ce | 10 | 99.7 | 5 | 190 | 111 | |
| Example 16 | $(Gd_{0.8}Y_{0.2})_2SiO_5$:Ce | 10 | 99.7 | 2 | 194 | 110 | |
| Example 17 | $(Gd_{0.8}Y_{0.2})_2SiO_5$:Ce | 10 | 99.7 | 1 | 190 | 111 | |
| Example 18 | $(Gd_{0.8}Y_{0.2})_2SiO_5$:Ce | 10 | 99.7 | 0.5 | 185 | 112 | |
| Example 19 | $(Gd_{0.8}Y_{0.2})_2SiO_5$:Ce | 10 | 99.7 | 0.3 | 180 | 113 | |
| Example 20 | $(Gd_{0.8}Y_{0.2})_2SiO_5$:Ce | 10 | 99.7 | 0.1 | 170 | 114 | |

As can be seen from the Table 2, all results of the afterglow time according to Examples were 200 ns or less and even 150 ns or less, and thus the characteristics equivalent to that of a conventional resin-mixed type were shown.

As described above, since the solid scintillators according to Examples have equivalent light output and further do not use resins as a component of the scintillator, gas generation during use can be eliminated. Therefore, it is possible to provide a solid scintillator having high long-term reliability and good handling characteristics.

The several embodiments of the present invention have been described, but these embodiments are those presented as examples and are not intended to limit the scope of the invention. These new embodiments can be embodied in various other forms, and various eliminations, replacements and other changes are possible, without departing from the gist of the invention. Also these embodiments and modifications thereof are to be included within the scope and gist of the present invention, and are included within the scope of the present invention stated in the claims and equivalents thereof.

REFERENCE SIGNS LIST

1 SEM apparatus
5 Afterglow time measurement apparatus
12 Electron gun
13 Focusing lens
14 Scanning coil
15 Objective lens
16 Measurement sample
17 Secondary electron detection unit
18 Monitor
19 Electron beam
20 Secondary electron
21 Solid scintillator
22 Photoelectron multiplier tube
23 Nd:YAG pulse laser oscillator
24, 24a, 24b Condenser lens
25 Optical fiber
26 Spectroscope
27 ICCD
28 Pulse generator
29 Personal computer
31 Input surface
32 Output surface
41 Laser light
42 Light

The invention claimed is:

1. A solid scintillator comprising a rare earth oxide sintered body, wherein:
    an afterglow time, which is the time required for a light output from the solid scintillator to degrease from a maximum value to 1/e of the maximum value, is 200 ns or shorter, and
    the rare earth oxide sintered body has a composition represented by a following general formula (1):

[Formula 1]

$$Ln_aX_bO_c:Ce \qquad (1)$$

wherein Ln is one or more elements selected from Y, Gd and Lu; X is one or more elements selected from Si, Al and B; and a, b and c satisfy 1≤a≤5, 0.9≤b≤6, and 2.5≤c≤13, respectively.

2. The solid scintillator according to claim 1, wherein the rare earth oxide sintered body has a composition represented by a following general formula (2):

[Formula 2]

$$Y_2O_3 \cdot \beta^1 SiO_2:Ce \qquad (2)$$

wherein $\beta^1$ satisfies $0.95 < \beta^1 < 1.05$.

3. The solid scintillator according to claim 1, wherein the rare earth oxide sintered body has a composition represented by a following general formula (3):

[Formula 3]

$$\alpha^2 Y_2O_3 \cdot \beta^2 Al_2O_3:Ce \qquad (3)$$

wherein $\alpha^2$ and $\beta^2$ satisfy $1.45 < \alpha^2 < 1.55$ and $2.45 < \beta^2 < 2.55$, respectively.

4. The solid scintillator according to claim 1, wherein the rare earth oxide sintered body has a composition represented by a following general formula (4):

[Formula 4]

$$\alpha^3 Y_2O_3 \cdot \beta^3 Al_2O_3:Ce \qquad (4)$$

wherein $\alpha^3$ and $\beta^3$ satisfy $0.45 < \alpha^3 < 0.55$ and $0.45 < \beta^3 < 0.55$, respectively.

5. The solid scintillator according to claim 1, wherein the rare earth oxide sintered body has a composition represented by a following general formula (5):

[Formula 5]

$$\alpha^4 Y_2O_3 \cdot \beta^4 Al_2O_3:Ce,Pr \qquad (5)$$

wherein $\alpha^4$ and $\beta^4$ satisfy $0.45 < \alpha^4 < 0.55$ and $0.45 < \beta^4 < 0.55$, respectively.

6. The solid scintillator according to claim 1, wherein the rare earth oxide sintered body has a composition represented by a following general formula (6):

[Formula 6]

$$0.8Gd_2O_3 \cdot 0.2Y_2O_3 \cdot \beta^5 SiO_2:Ce \qquad (6)$$

wherein $\beta^5$ satisfies $0.95 < \beta^5 < 1.05$.

7. The solid scintillator according to claim 1, wherein the rare earth oxide sintered body has an average crystal particle size of 1 to 20 μm.

8. The solid scintillator according to claim 1, wherein the rare earth oxide sintered body has a relative density of 99% or more.

9. The solid scintillator according to claim 1, wherein surface roughness Ra of an output surface outputting light to a photoelectron multiplier tube side is 0.3 to 10 μm.

10. An electron beam detector using a solid scintillator according to claim 1.

11. The electron beam detector according to claim 10 comprising a photoelectron multiplier tube.

12. The electron beam detector according to claim 10, wherein the electron beam detector is used in a SEM apparatus.

* * * * *